United States Patent [19]
Sakuragi

[11] Patent Number: 6,137,356
[45] Date of Patent: Oct. 24, 2000

[54] OPERATIONAL AMPLIFIER WITH MEANS FOR CHANGING A RESISTANCE VALUE OF AN ACTIVE FEEDBACK ELEMENT

[75] Inventor: Takamasa Sakuragi, Hiratsuka, Japan

[73] Assignee: Canon Kabushiki Kaisha, Tokyo, Japan

[21] Appl. No.: 09/253,782

[22] Filed: Feb. 22, 1999

[30] Foreign Application Priority Data

Feb. 23, 1998 [JP] Japan .................................. 10-040175

[51] Int. Cl.[7] ................................................... H03G 3/20
[52] U.S. Cl. .............................. 330/86; 330/292; 330/136
[58] Field of Search .............................. 330/86, 110, 136, 330/144, 282, 292

[56] References Cited

U.S. PATENT DOCUMENTS

| | | | |
|---|---|---|---|
| 4,216,434 | 8/1980 | Wermuth | 330/86 |
| 4,716,305 | 12/1987 | Sakuragi et al. | 330/288 X |
| 4,758,773 | 7/1988 | Fushimi et al. | 323/251 |
| 4,807,009 | 2/1989 | Fushimi et al. | 357/35 |
| 5,349,595 | 9/1994 | Ogawa et al. | 372/38 |
| 5,444,413 | 8/1995 | Kimura et al. | 327/562 |
| 5,455,580 | 10/1995 | Sakuragi et al. | 341/133 |
| 5,481,225 | 1/1996 | Lumsden et al. | 330/292 X |
| 5,786,730 | 7/1998 | Hadley | 330/308 X |
| 5,880,639 | 3/1999 | Sakuragi | 330/255 |

OTHER PUBLICATIONS

Patent Abstracts of Japan, JP 06–216662, Aug. 1994.
Patent Abstracts of Japan, JP 63–136803, Jun. 1988.

*Primary Examiner*—Steven J. Mottola
*Attorney, Agent, or Firm*—Fitzpatrick, Cella, Harper & Scinto

[57] ABSTRACT

An operational amplifier includes an operational amplification means having a phase compensation capacitor, an active element connected in series to the phase compensation capacitor and having a variable resistance value, and a differential control means for changing the resistance value of the active element on the basis of a difference voltage between inputs to the operational amplification means, whereby stable operation and high-speed operation are realized.

4 Claims, 6 Drawing Sheets

OPERATIONAL AMPLIFIER WITH MEANS FOR CHANGING A RESISTANCE VALUE OF AN ACTIVE FEEDBACK ELEMENT

BACKGROUND OF THE INVENTION

1. Field of the Invention

The present invention relates to an operational amplifier and, more particularly, to an operational amplifier for amplifying a signal.

2. Related Background Art

Figure 6:
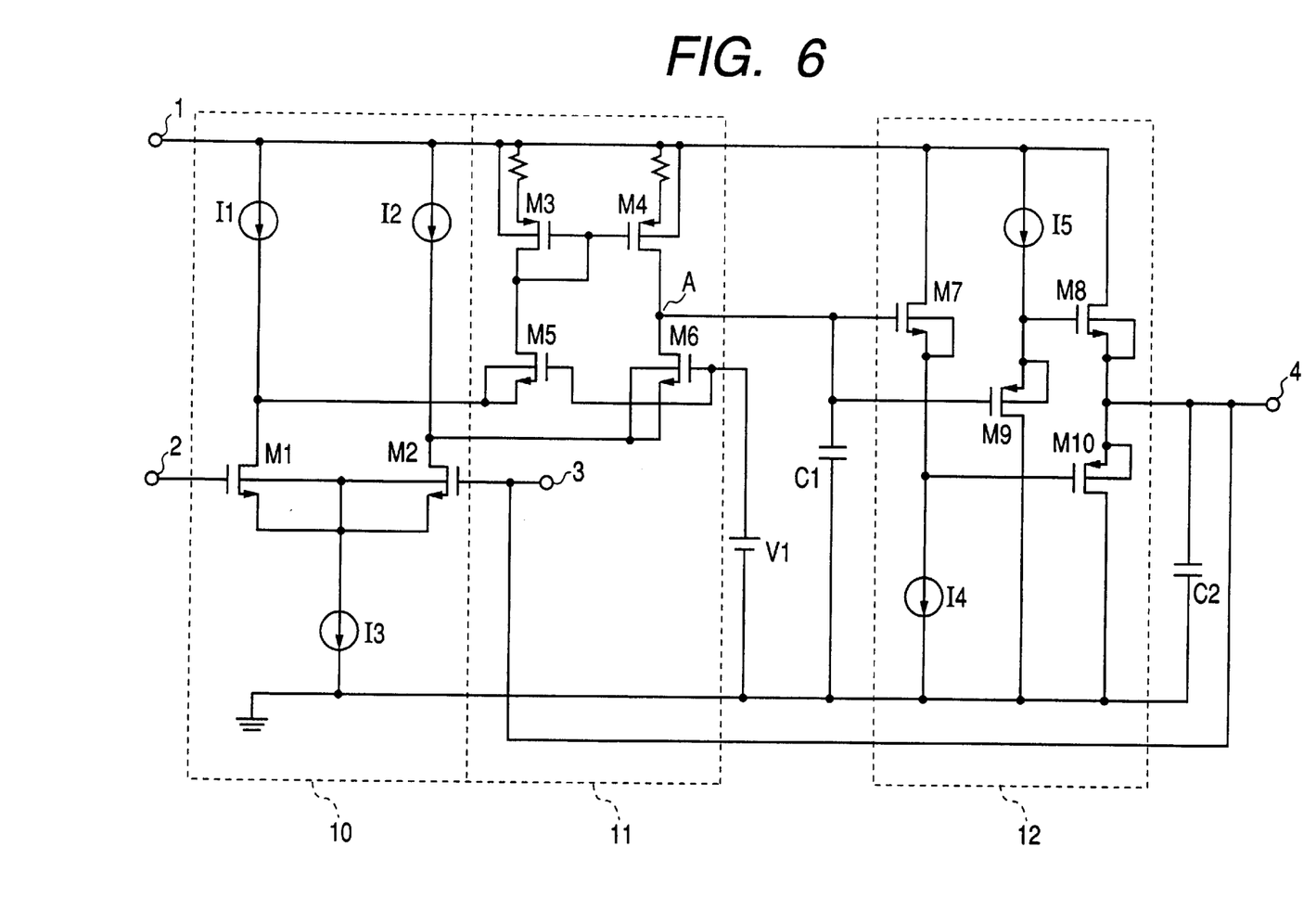
FIG. 6 is a circuit diagram showing the arrangement of a conventional operational amplifier.

FIG. 6 is a circuit diagram showing an arrangement of a conventional operational amplifier. The operational amplifier shown in FIG. 6 is a so-called folded-cascade-type operational amplifier. Referring to FIG. 6, a block 10 represents an input differential stage; a block 11, a voltage amplification stage; and a block 12, an output buffer stage. The operational amplifier comprises nMOS transistors M1, M2, and M5 to M8, pMOS transistors M3, M4, M9, and M10, bias setting constant current sources I1 to I5 for transistors, a phase compensation capacitor C1, a load capacitor C2 connected to an output terminal 4, a voltage source V1 for applying a gate bias voltage to the common gate transistors M5 and M6, a power supply terminal 1, a positive input terminal 2, a negative input terminal 3, and an output terminal 4. When the output terminal 4 and negative input terminal 3 are short-circuited, this operational amplifier operates as a voltage follower.

To amplify outputs from various signal sources represented by a sensor such as a CCD using such an operational amplifier, low random noise, high speed, high stability, low power consumption, high accuracy (high open loop gain), and the like are required for the operational amplifier.

It is important to suppress random noise which directly influences the S/N ratio or dynamic range of a signal. When sampling of a sensor output changing stepwise is required to digitally process the signal output from a CCD sensor for handling a highly accurate video signal, the step response output from the operational amplifier must quickly change in response to the input and immediately settle to the final value. In this case, high speed and high stability are important. When the operational amplifier is used as a voltage follower, as shown in FIG. 6, the open loop gain of the operational amplifier must be relatively high to obtain a highly accurate output because the accuracy of the output voltage is proportional to the open loop gain of the operational amplifier. Many products for processing video data are driven by batteries, and the operable time of the products must be long. In this case, it is important to reduce power consumption.

However, the above-described performances required for the operational amplifier are traded off each other, as will be described below.

Random noise generated in the operational amplifier shown in FIG. 6 includes flickering noise representing so-called 1/f (f is the frequency) characteristics and thermal noise due to the channel resistance or the like of a MOS transistor, and the noise is mainly generated by the input MOS transistors M1 and M2. The thermal noise whose magnitude has no dependence on the frequency especially has a large influence in a wide-band amplifier. When the noise is figured out as a noise voltage source at the gate input, a magnitude V of thermal noise is given by $$\overline{V^2} = 4kT \cdot \frac{2}{3g_m} \cdot \Delta f \qquad (1)$$

where $\Delta f$ is the bandwidth, and $g_m$ is the transconductance.

As is apparent from equation (1), the thermal noise is inversely proportional to the transconductance $g_m$ of the transistors.

Figure 7:
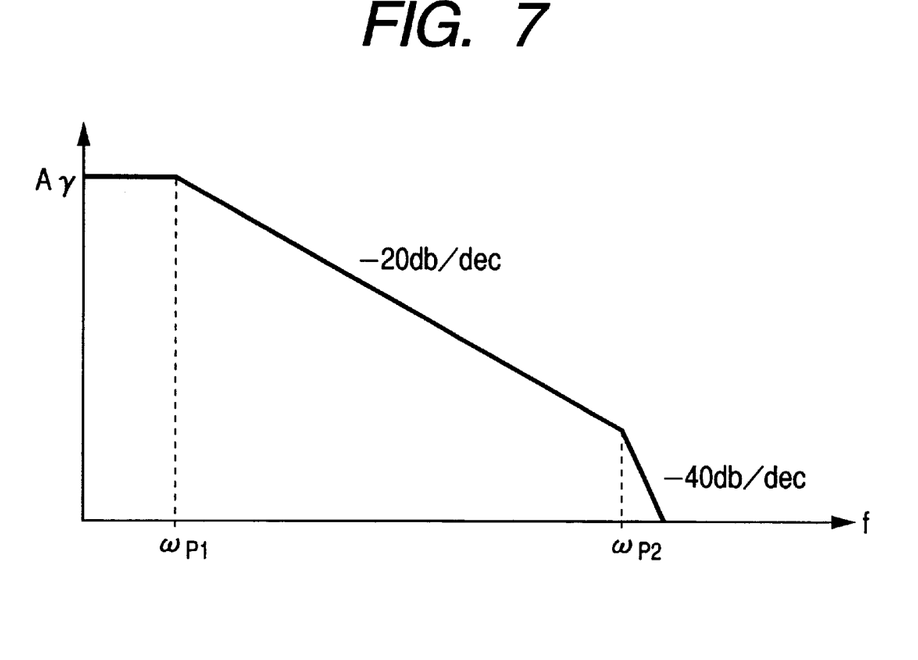
FIG. 7 is a graph showing the frequency characteristics of the open loop voltage gain of the operational amplifier.

The value of the open loop voltage gain of the operational amplifier shown in FIG. 6 in a low-frequency region is represented by $g_{mi}R_L$, where $g_{mi}$ is the transconductance of the input MOS transistors M1 and M2, and $R_L$ is the impedance at a point A in FIG. 6. FIG. 7 shows the frequency characteristics of the open loop voltage gain of the operational amplifier. Referring to FIG. 7, $\omega_{P1}$ is the first pole, and $\omega_{P2}$ is the second pole. Normally, the first pole $\omega_{P1}$ is determined by the capacitance of the phase compensation capacitor C1 and the impedance $R_L$ at the point A in FIG. 6, and the second pole $\omega_{P2}$ is determined by the synthesized output impedance of the output MOS transistors M8 and M10 and the capacitance of the load capacitor C2.

The settling time (time after a step input is supplied to the operational amplifier and until the output from the operational amplifier changes in accordance with the input and reaches a value corresponding to ±0.1% or ±0.01% of the final value) representing the stability of the amplifier depends on the magnitude of the open loop gain at the frequency $\omega_{P2}$. When the magnitude is 0 dB or less, and as it is becomes smaller, ringing in the step response becomes small, so the settling time shortens. The magnitude of the load capacitor C2 cannot be arbitrarily decreased in many cases. To move the frequency $\omega_{P2}$ to a high frequency side, the transconductances $g_m$ of the output transistors M8 and M9 must be increased. For this purpose, the ratio (W/L) of a gate width W to a gate length L of the output transistors M8 and M9 is made high and the drain current is made to increase. However, when the ratio W/L becomes higher, the occupation area of the semiconductor chip increases, resulting in an increase in cost. Additionally, an increase in drain current results in an increase in current consumption. Hence, the frequency $\omega_{P2}$ cannot be largely moved to the high-frequency side.

To increase the stability of the amplifier, the frequency $\omega_{P1}$ is moved to the low-frequency side, or the open loop gain itself is decreased. However, to move the frequency $\omega_{P1}$ to the low-frequency side, the capacitance of the phase compensation capacitor must be increased, resulting in a decrease in slewing rate representing the high-speed operability of the amplifier.

As the final technique, the open loop gain is decreased. To do this, the transconductances $g_m$ of the input transistors must be made small. However, the transconductances $g_m$ of the input transistors are directly associated with random noise, as described above, and therefore, cannot be decreased.

SUMMARY OF THE INVENTION

It is an object of the present invention to provide an operational amplifier capable of simultaneously having all required performances which are conventionally traded off each other.

It is another object of the present invention to provide an operational amplifier for performing stable high-speed operation by suppressing ringing and improving the slewing rate.

According to the first aspect of the present invention, there is provided an operational amplifier comprising operational amplification means having a phase compensation capacitor, an active element connected in series to the phase compensation capacitor and having a variable resistance value, and differential control means for changing the resistance value of the active element on the basis of a difference between inputs to the operational amplification means.

According to the second aspect of the present invention, in the operational amplifier of the first aspect, the differential control means increases the resistance value of the active element when an offset is given to the differential inputs, and a difference between the inputs of the operational amplification means has a value not less than the offset value, and decreases the resistance value of the active element when the difference between the inputs of the operational amplification means has a value less than the offset value.

According to the third aspect of the present invention, in the operational amplifier of the first or second aspect, the active element comprises a field effect transistor, and an output terminal of the differential control means is connected to a gate of the field effect transistor.

According to the fourth aspect of the present invention, in the operational amplifier of the first or second aspect, the active element comprises a bipolar transistor, and an output terminal of the differential control means is connected to a base of the bipolar transistor.

In the present invention, an active element is connected in series to, e.g., a phase compensation capacitor, and the resistance of the active element is changed in accordance with the state of the operational amplification means. For example, when the difference between the inputs in the step response is large, the resistance of the active element connected in series to the phase compensation capacitor is increased to prevent a decrease in slewing rate. When the output is close to the input, i.e., the difference between the inputs becomes small, the resistance of the active element is decreased to shift the frequency $\omega_{P1}$ to the low-frequency side, thereby increasing the stability of the amplifier.

DESCRIPTION OF THE PREFERRED EMBODIMENT

Figure 1:
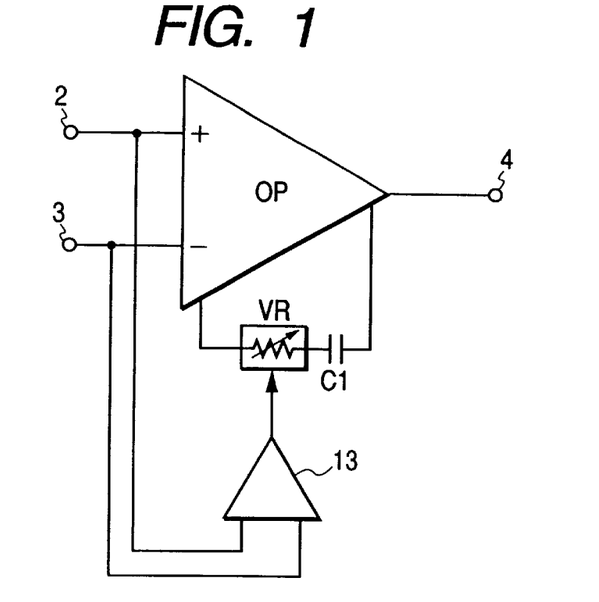
FIG. 1 is a circuit diagram showing the principle of the present invention.

FIG. 1 shows the principle of the present invention, and this arrangement includes an original operational amplifier OP for amplifying an input signal, and an active element VR having variable resistance characteristics, which receives the output from an amplifier 13 serving as a differential control means and changes the resistance in accordance with the output. The arrangement also has a phase compensation capacitor C1 used for the operational amplifier OP. The amplifier 13 is a differential amplifier for detecting the voltage difference between the positive and negative inputs to the operational amplifier OP and supplying an output based on the difference to the variable resistance element VR to control the resistance value of the variable resistance element VR. The differential inputs to the amplifier 13 have an offset. As described above, the polarities are set such that when the inputs voltage difference from the operational amplifier OP has a value equal to or larger than the offset value (with respect to the input voltage given to the input terminal), the resistance value of the active element is increased, and when the inputs voltage difference from the operational amplifier OP has a value smaller than the offset value (with respect to the input voltage given to the input terminal), the resistance value of the active element is decreased. The optimum offset value is determined in consideration of the slewing rate and settling in the step response of the operational amplifier OP.

As the active element or variable resistance element VR used in the present invention, a field effect transistor or a bipolar transistor can be used.

The technical background of the present invention will be described on the basis of the operation of the conventional operational amplifier shown in FIG. 6.

When the negative input terminal (to be referred to as a (−) input hereinafter) and output terminal of the operational amplifier shown in FIG. 6 are short-circuited, a voltage almost equal to that supplied to the positive input terminal (to be referred to as a (+) input hereinafter) of the operational amplifier appears at the output terminal, so the operational amplifier functions as a so-called "voltage follower". A case wherein a step input is supplied to the (+) input terminal with negative feedback, as in the voltage follower, will be described.

Figure 2:
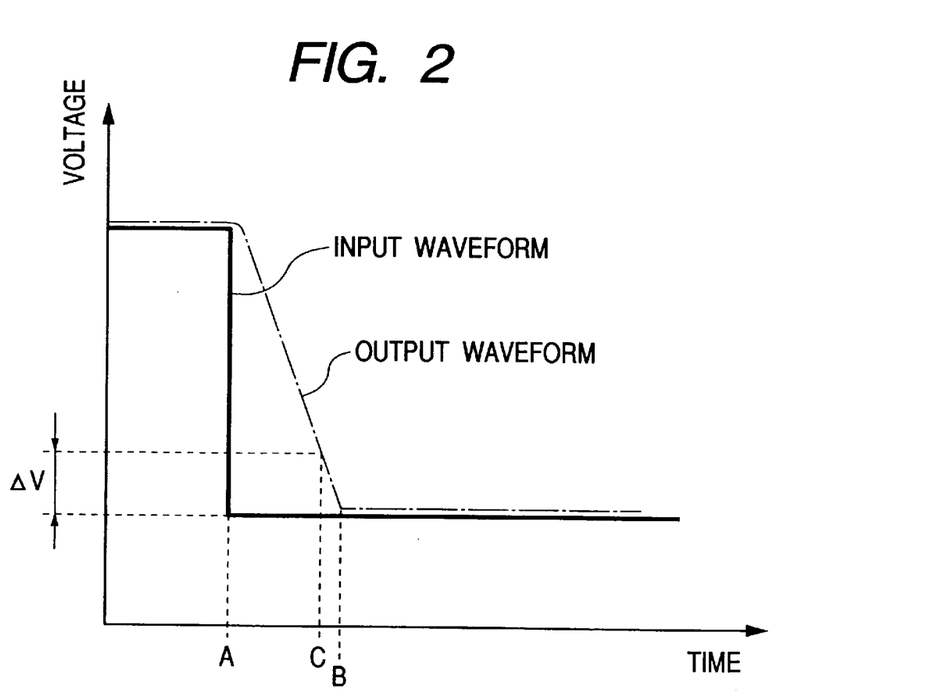
FIG. 2 is a graph showing the relationship between the output and input of an operational amplifier.

When an input which changes at a high speed beyond the maximum slewing rate of the operational amplifier is supplied, the output and input of the operational amplifier normally have a relationship shown in FIG. 2. A differential transistor pair of the differential stage corresponding to a block 10 and the voltage amplification stage corresponding to a block 11, which amplify a signal in the operational amplifier, do not balance in a section A-B on the time axis. The drain current of a MOS transistor M1 has a value almost equal to that of a bias constant current source I3, and a MOS transistor M2 is almost cut off. The drain current of the MOS transistor M1 flows through a common gate MOS transistor M5 and MOS transistors M3 and M4 constituting a current mirror circuit to charge a phase compensation capacitor C1. In this state, the relationship between the gain and stability in a small signal operation, which has been described with reference to FIG. 7, does not hold. For this reason, oscillation or stability performance does not degrade even without phase compensation.

More specifically, when the phase compensation capacitor C1 is absent, the voltage at a point (A) in FIG. 6 rises at a very high speed. However, from time B in FIG. 2, the output from the operational amplifier is considerably close to the input voltage, and the differential stage of the block 10 and the like in FIG. 6 almost return to a balanced state. For this reason, the above-described small signal theory holds. Unless the open loop gain at a frequency $\omega_{P2}$ shown in FIG. 7 is 0 dB or less, ringing or oscillation occurs in the output from the operational amplifier. Hence, from time B in FIG. 2, a phase compensation capacitor with a capacitance greater than or equal to a predetermined value is required.

As is apparent from the above description, in the step response of the operational amplifier, when the voltage difference between the input and output is large, the phase compensation capacitor is preferably omitted. When the voltage difference between the input and output is less than or equal to a predetermined value (i.e., when the small signal operation theory holds, and the differential input transistor pair of the input differential stage are not largely unbalanced), a phase compensation capacitor having a predetermined capacitance greater than or equal to a predetermined value (e.g., a phase compensation capacitor for forming $\omega_{P1}$ at which the gain at $\omega_{P2}$ in FIG. 7 becomes 0 dB) is required.

In the present invention, to effectively change the capacitance value, a variable resistor is connected in series to the phase compensation capacitor to change the resistance value. The value of the resistor connected in series to the phase compensation capacitor preferably changes from 0 to infinity. In fact, even when the resistance value is not set to be as small as zero, the purpose can be achieved at a predetermined value or less. Hence, the resistor whose value must be changed can be constituted by an active element such as a transistor. The ON resistance can be changed by changing the voltage to be applied to the gate when the transistor as the variable resistor is a MOS transistor, or the base when the transistor is a bipolar transistor.

Figure 3:
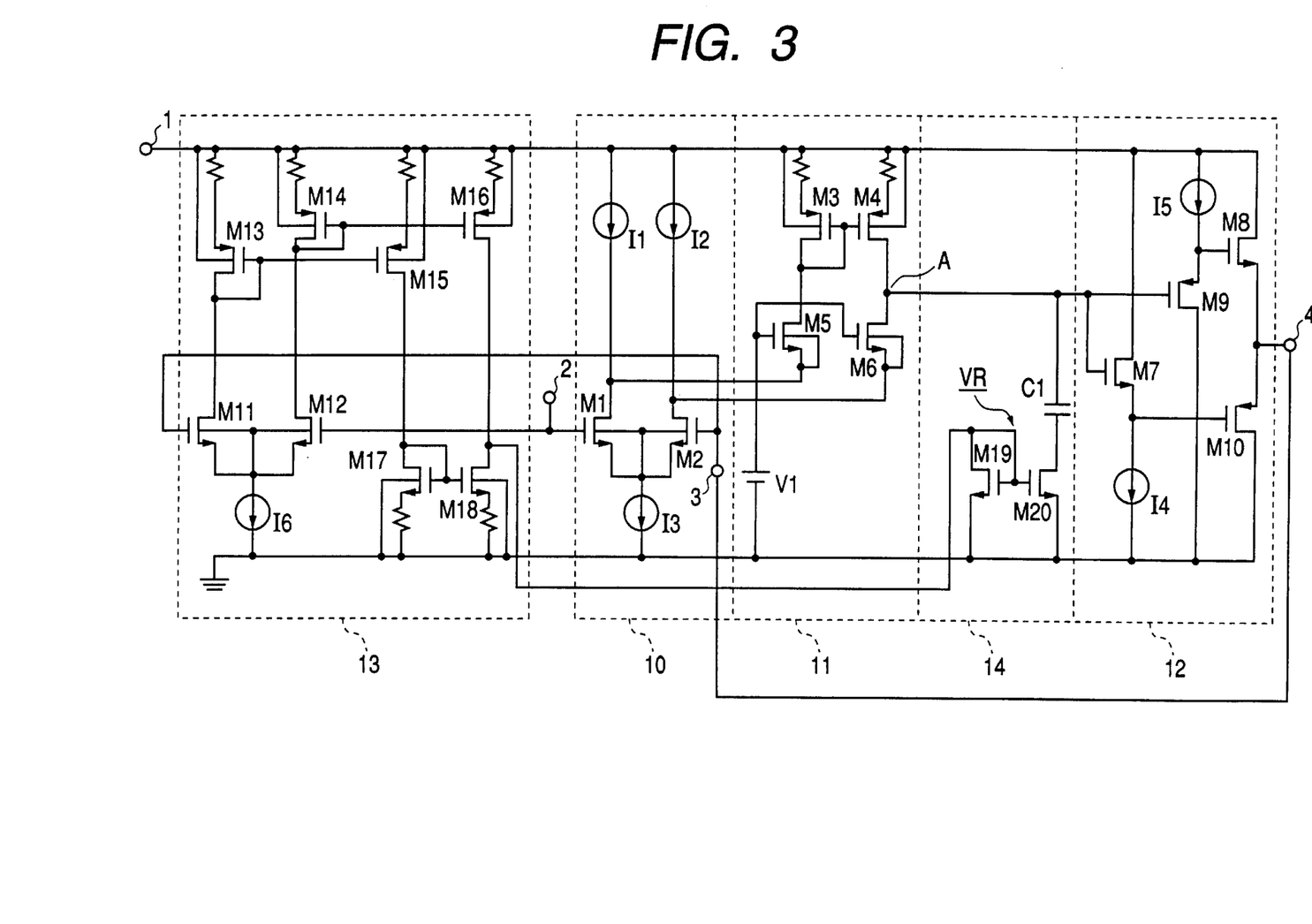
FIG. 3 is a circuit diagram showing an embodiment of the present invention.

FIG. 3 is a circuit diagram showing an embodiment of the present invention. Referring to FIG. 3, this circuit comprises a power supply terminal 1, a positive input terminal 2, a negative input terminal 3, an output terminal 4, constant current sources I1 to I6 for supplying a bias current in each circuit block, a phase compensation capacitor C1, a constant voltage source V1 for supplying the gate bias voltage of common gate transistors M5 and M6, a block 10 as a first input differential stage, a block 11 as a voltage amplification stage including the common gate transistors, a block 12 as an output buffer stage, a block 13 as a second input differential stage for controlling the ON resistance of a transistor M20 and connected in series to the phase compensation capacitor C1 to have a variable resistance function, a block 14 as a circuit block comprising an nMOS transistor M19 serving as a load resistor for receiving the output current from the amplifier 13 as the input differential stage of the block 13 and converting the current into a voltage, the nMOS transistor M20 whose ON resistance changes upon receiving the voltage generated by the nMOS transistor M19, and the phase compensation capacitor C1. In the blocks, transistors M1, M2, M5 to M8, M11, M12, and M17 to M20 are nMOS transistors, and transistors M3, M4, M9, M10, and M13 to M16 are pMOS transistors.

The operation of the above circuit will be described below.

In the circuit shown in FIG. 3, the active element serving as the variable resistor is the nMOS transistor M20. The differential stage of the amplifier 13 serves as a differential control stage for detecting the difference between the input voltage and output voltage of the operational amplifier (10, 11, and 12), converting the difference voltage into a current, and transmitting the current by the current mirror circuit formed by the MOS transistors M13 to M18. The transmitted current is converted into a voltage by the load resistor formed from the nMOS transistor M19 having short-circuited gate and drain. The converted voltage is applied to the gate of the nMOS transistor M20 as a value based on the difference between the input voltage and output voltage of the operational amplifier.

The timing for changing the ON resistance of the nMOS transistor M20 when the output voltage is close to the input voltage in the step response of the operational amplifier shown in FIG. 2 will be described next.

In the section from time A to time C in FIG. 2, preferably, the resistance of the nMOS transistor M20 is almost ∞, and the slewing rate of the operational amplifier is maximized. In the section from time C to time B, the ON resistance of the nMOS transistor M20 preferably abruptly becomes low. Near time B, preferably, the ON resistance of the nMOS transistor M20 is preferably sufficiently low so that the capacitor C1 functions as a phase compensation capacitor to improve the stability of the operational amplifier, and the output from the operational amplifier quickly approaches the input voltage without causing ringing. Hence, the second differential input stage of the block 13 in FIG. 3, which controls the ON resistance of the nMOS transistor M20, preferably intentionally gives an offset voltage corresponding to ΔV in FIG. 2.

The operation of the second differential input stage when the input to the MOS transistor M11 has a higher polarity than that of the input to the MOS transistor M12 and an offset voltage corresponding to ΔV will be described.

In the step response shown in FIG. 2, until time A, the input voltage and output voltage of the operational amplifier almost equal. Referring to FIG. 3, the input voltage of the MOS transistor M12 connected to the (+) input and the input voltage of the MOS transistor M11 connected to the (−) input also almost equal and have the offset voltage ΔV. For this reason, an output current corresponding to $g_m\Delta V$ ($g_m$ is the transconductance of the second input differential stage) appears at the output of the second differential input stage of the block 13. The current is converted into a voltage by the MOS transistor M19. The voltage is applied to the gate of the MOS transistor M20, so the MOS transistor M20 exhibits an ON resistance based on the voltage.

In the section from time A to time C in FIG. 2, the (+) input voltage of the operational amplifier is lower than the output voltage (=(−) input voltage) by ΔV or more. For this reason, the MOS transistor M12 in the block 13 of the second input differential stage in FIG. 3 is almost cut off, and a current almost equal to the constant current source I6 flows to the drain of the MOS transistor M11. Since no current is supplied to the MOS transistor M19, the gate voltage of the MOS transistor M20 also becomes 0 V, so the resistance of the MOS transistor M20 has a very large value.

In the section from time C to time B in FIG. 2, the voltage difference between the (+) input and output of the operational amplifier is smaller than ΔV. An output current gradually starts to appear at the output of the block 13 of the second input differential stage in FIG. 3, and a voltage starts to appear at the drain of the MOS transistor M19 (=the gate of the MOS transistor M20), so the ON resistance of the MOS transistor M20 lowers. The operation from time B in FIG. 2 is the same as that in the section from the initial time to time A.

As described above, while the output voltage is in transition due to a change in resistance of the MOS transistor M20 in the step response, the phase compensation capacitor is effectively substantially disconnected from the output terminal of the voltage amplification stage 11, and the phase compensation function is inactive. As the output voltage approaches to the input voltage, the phase compensation capacitor gradually is enabled to function.

Figure 4:
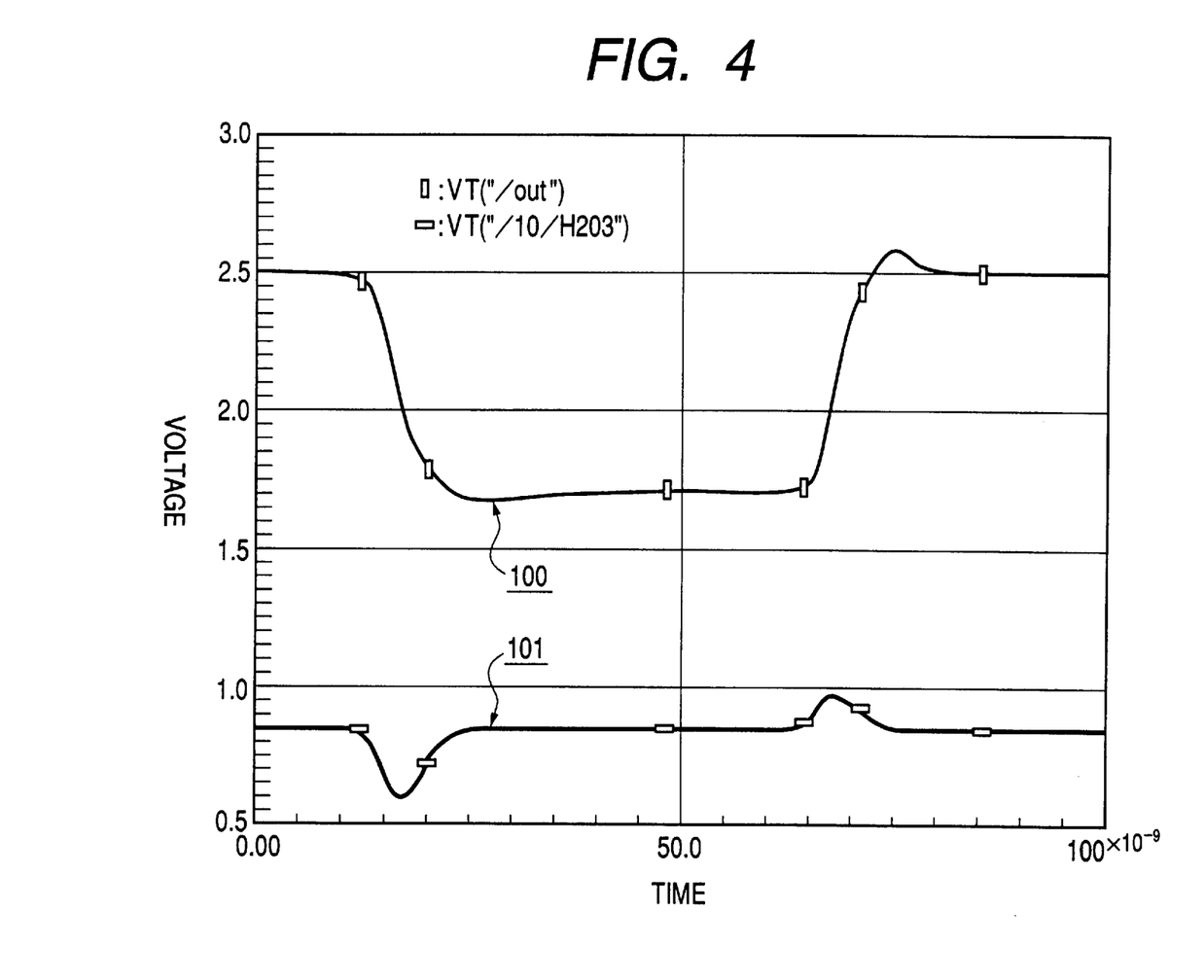
FIG. 4 is a graph showing a SPICE simulation result representing the output waveform of the step response of the operational amplifier according to the present invention and the gate voltage waveform of a MOS transistor M20 at that time.
Figure 5:
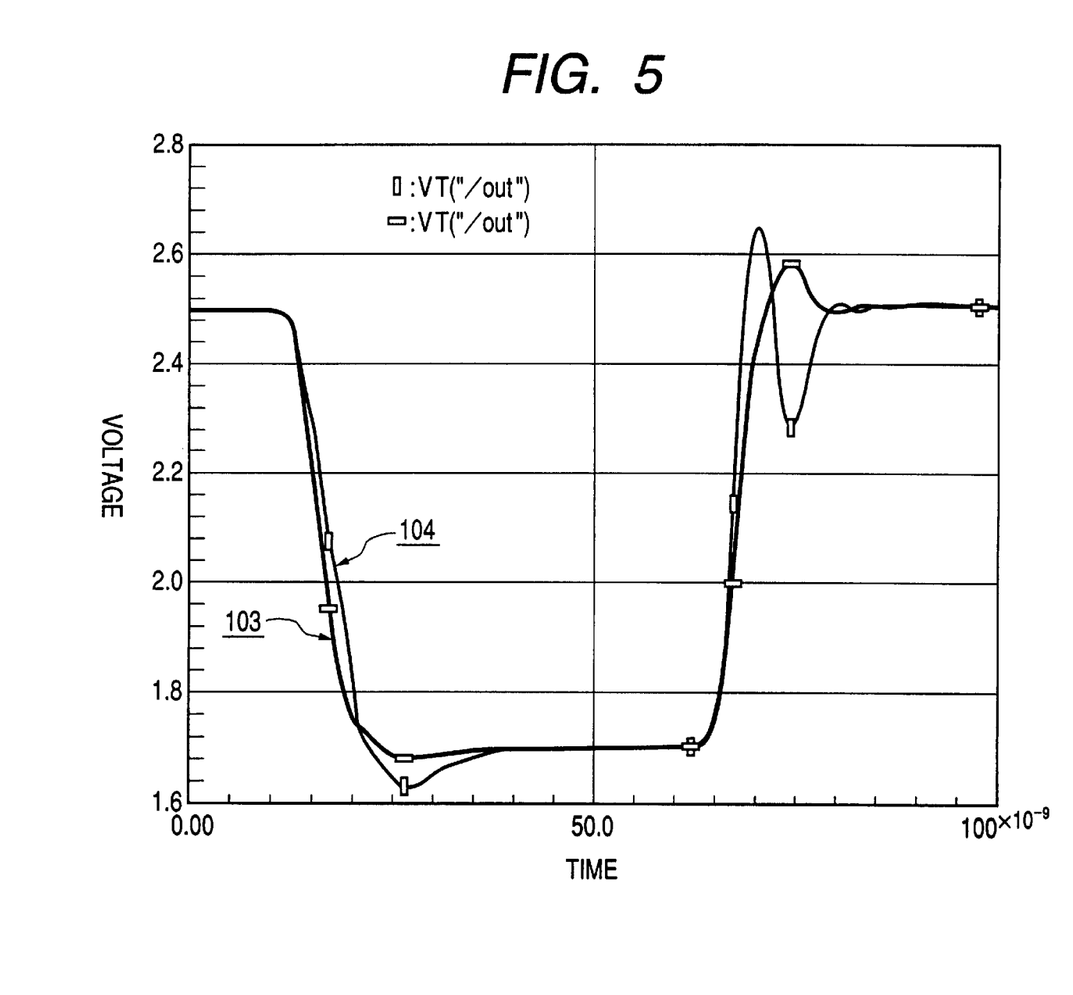
FIG. 5 is a graph showing the comparison in phase compensation schemes between this embodiment and a prior art.

FIG. 4 shows a SPICE simulation result representing an operational amplifier output waveform 100 of this embodiment in the step response as in FIG. 2 and a gate voltage waveform 101 of the MOS transistor M20 in FIG. 3 at that time. As is apparent from FIG. 4, only while the amplifier output transition to the lower side, the gate voltage of the MOS transistor M20 lowers (i.e., the resistance of the MOS transistor M20 increases). When the output is close to the input, the gate voltage of the MOS transistor M20 begins to increase, and phase compensation functions, so no ringing is generated in the amplifier output. FIG. 5 shows a step response 104 of a conventional amplifier in which no resistor is connected in series to the phase compensation capacitor, and a step response 103 of the embodiment of the present invention in which the variable ON resistance MOS transistor M20 and a control amplifier therefor are connected to the phase compensation capacitor, and the amplifier main body is not changed at all. It is found from FIG. 5 that the slewing rate and settling of the amplifier are improved.

The MOS transistor M20 in FIG. 3 of the embodiment of the present invention is not limited to this, and any other element can be used as far as it is an active element whose ON resistance value can change in accordance with the input.

The block 13 of the second input differential stage in FIG. 3 is not limited to that shown in FIG. 3 as far as it outputs a voltage or current for changing the resistance value of the variable resistance element connected in series to the phase compensation capacitor, and the output has a value corresponding to the magnitude of the difference between the output and (+) input of the operational amplifier. The polarity of the offset (corresponding to ΔV in FIG. 2) in comparing the output voltage with the (+) input voltage of the operational amplifier is set such that the resistance value of the variable resistance element becomes large during the transition period of the operational amplifier output in the step response, and small when the operational amplifier output is close to the input. The offset value can be appropriately set to a desired value by making the sizes of a pair of transistors, e.g., M11 and M12, M13 and M14, M15 and M16, or M17 and M18 or values of resistors connected to the sources different from each other.

As has been described above, according to the embodiment of the present invention, the slewing rate and setting in the step response of the operational amplifier are improved without changing the circuit arrangement of the operational amplifier, or constants such as the transistor size, resistance, and capacitance. For this reason, the transconductance $g_m$ of the input transistor at the first stage of the operational amplifier or the open loop gain of the operational amplifier can be increased as compared to the prior art, and therefore, the important characteristics of the operational amplifier, e.g., low noise and highly accurate output can be improved.

What is claimed is:

1. An operational amplifier comprising:

operational amplification means having a phase compensation capacitor;

an active element connected in series to said phase compensation capacitor and having a variable resistance value; and differential control means for changing the resistance value of said active element on the basis of a difference between inputs to said operational amplification means.

2. An amplifier according to claim 1, wherein said differential control means increases the resistance value of said active element when a difference between voltage inputs or current inputs of said operational amplification means has a value not less than an offset value, and decreases the resistance value of said active element when the difference between the voltage inputs or current inputs of said operational amplification means has a value less than the offset value.

3. An amplifier according to claim 1 or 2, wherein said active element comprises a field effect transistor, and an output terminal of said differential control means is connected to a gate of said field effect transistor.

4. An amplifier according to claim 1 or 2, wherein said active element comprises a bipolar transistor, and an output terminal of said differential control means is connected to a base of said bipolar transistor.

* * * * *